(12) United States Patent
Wachtler et al.

(10) Patent No.: US 6,274,391 B1
(45) Date of Patent: Aug. 14, 2001

(54) HDI LAND GRID ARRAY PACKAGED DEVICE HAVING ELECTRICAL AND OPTICAL INTERCONNECTS

(75) Inventors: Kurt P. Wachtler; David N. Walter, both of Richardson; Larry J. Mowatt, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 07/966,645

(22) Filed: Oct. 26, 1992

(51) Int. Cl.$^7$ ............................ H01L 21/00; H01L 21/44; H01L 21/48; H01L 21/50

(52) U.S. Cl. .................................. 438/6; 438/25; 438/27; 438/31; 438/59; 438/63; 438/65; 438/71; 438/72; 438/116; 438/121

(58) Field of Search .................................. 257/680, 686, 257/777; 437/205

(56) References Cited

U.S. PATENT DOCUMENTS

| 3,881,971 | * | 5/1975 | Greer et al. ............................ 156/3 |
| 3,903,590 | * | 9/1975 | Yokogawa ............................ 29/577 |
| 4,245,273 | * | 1/1981 | Feinberg et al. ..................... 361/382 |
| 4,544,989 | * | 10/1985 | Nakabu et al. ....................... 361/401 |
| 4,554,229 |   | 11/1985 | Small, Jr. .............................. 430/17 |

(List continued on next page.)

FOREIGN PATENT DOCUMENTS

| 2810054 | * | 9/1978 | (DE) . |
| 2130794 | * | 6/1984 | (GB) . |
| 58-218176 | * | 12/1983 | (JP) ..................................... 257/434 |
| 63-293965 | * | 11/1988 | (JP) ..................................... 437/902 |

OTHER PUBLICATIONS

GE Technical Information Series; "The STD Process–New Developments and Applications", R.J. Clark et al., Aug. '74.*

Proceeding of ISHM; "High Density Interconnects Using Laser Lithography", Levinson et al., Oct. '88.*

*Microelectronics Packaging Handbook*, New York, Van Nostrand Reinhold, 1989, pp. 702 and 721, TK7874.T824 1988.*

(List continued on next page.)

*Primary Examiner*—David E. Graybill
(74) *Attorney, Agent, or Firm*—Ronald O. Neerings; Wade James Brady, III; Frederick J. Telecky, Jr.

(57) ABSTRACT

A high density interconnect land grid array package device combines various electronic packaging techniques in a unique way to create a very thin, electrically and thermally high performance package for single or multiple semiconductor devices. A thin and mechanically stable substrate or packaging material (12) is selected that also has high thermal conductivity. Cavities (14) in the substrate or packaging material (12) accommodate one or more semiconductor devices that are attached directly to the substrate or packaging material. At least one of said semiconductor devices includes at least one optical receiver and/or transmitter. A thin film overlay (18) having multiple layers interconnects the one or more semiconductor devices to an array of pads (20) on a surface of the thin film overlay facing away from the substrate or packaging material. Solder balls (22), conductive adhesive or elastomeric connectors are attached to the pads to provide direct electrical and mechanical attachment means to other system hardware. In one embodiment of the invention, the optical receiver and/or transmitter receives and/or transmits light signals through the thin film overlay. In another embodiment of the invention, the optical receiver and/or transmitter receives and/or transmits light signals through holes (47) formed through the thin film overlay. The holes may be back filled with an optical quality material.

34 Claims, 9 Drawing Sheets

U.S. PATENT DOCUMENTS

| | | | |
|---|---|---|---|
| 4,617,085 | | 10/1986 | Cole, Jr. et al. .................... 156/643 |
| 4,714,516 | | 12/1987 | Eichelberger et al. ............. 156/628 |
| 4,725,504 | | 2/1988 | Knudsen et al. .................... 428/458 |
| 4,752,816 | * | 6/1988 | Sussman et al. ..................... 357/30 |
| 4,764,485 | | 8/1988 | Loughran et al. ................... 437/225 |
| 4,780,177 | | 10/1988 | Wojnarowski et al. ............. 156/643 |
| 4,783,695 | * | 11/1988 | Eichelberger et al. ............... 357/65 |
| 4,798,918 | | 1/1989 | Kabadi et al. ........................ 174/36 |
| 4,806,395 | | 2/1989 | Walsh ................................... 427/444 |
| 4,816,422 | | 3/1989 | Yerman et al. ....................... 437/51 |
| 4,824,716 | | 4/1989 | Yerman ............................... 428/209 |
| 4,835,704 | | 5/1989 | Eichelberger et al. ............. 364/490 |
| 4,842,677 | | 6/1989 | Wojnarowski et al. ............. 156/643 |
| 4,857,382 | | 8/1989 | Liu et al. ............................. 428/156 |
| 4,866,508 | | 9/1989 | Eichelberger et al. ............... 357/74 |
| 4,878,991 | | 11/1989 | Eichelberger et al. ............. 156/630 |
| 4,882,200 | | 11/1989 | Liu et al. ............................ 427/53.1 |
| 4,884,122 | | 11/1989 | Eichelberger et al. ............... 357/71 |
| 4,894,115 | | 1/1990 | Eichelberger et al. ............. 156/643 |
| 4,897,153 | * | 1/1990 | Cole et al. .......................... 156/643 |
| 4,901,136 | | 2/1990 | Neugebauer et al. ................ 357/54 |
| 5,048,179 | * | 9/1991 | Shindo et al. ........................ 29/840 |
| 5,049,978 | * | 9/1991 | Bates et al. ........................... 357/74 |
| 5,081,563 | * | 1/1992 | Feng et al. .......................... 361/414 |
| 5,093,879 | * | 3/1992 | Bregman et al. ..................... 385/93 |
| 5,144,747 | * | 9/1992 | Eichelberger et al. ............... 29/839 |
| 5,151,776 | | 9/1992 | Wojnarowski et al. ............... 357/81 |
| 5,157,255 | * | 10/1992 | Kornrumof et al. ............. 250/252.1 |
| 5,161,093 | * | 11/1992 | Gorczyca et al. .................. 361/414 |
| 5,196,371 | * | 3/1993 | Kulesza et al. ..................... 437/183 |
| 5,200,631 | * | 4/1993 | Austin et al. ......................... 257/81 |
| 5,206,712 | * | 4/1993 | Kornrumpf et al. ................ 361/393 |
| 5,237,434 | * | 8/1993 | Feldman et al. ...................... 359/19 |
| 5,241,456 | * | 8/1993 | Marcinkiewicz et al. .......... 361/792 |
| 5,249,245 | * | 9/1993 | Lebby et al. .......................... 385/89 |
| 5,250,843 | * | 10/1993 | Eichelberger ....................... 257/692 |
| 5,262,351 | * | 11/1993 | Bureau et al. ...................... 437/183 |
| 5,355,102 | * | 10/1994 | Kornrumpf et al. ................. 333/33 |

OTHER PUBLICATIONS

Microelectronics Packaging Handbook, New York, Van Nostrand Reinhold, 1989, pp. 376–378. TK7874, T824 1988.*

*Thin Film Microelectronics*, Edited by L. Holland, John Wiley & Sons, 1965, New York.

*Thin Film Technologies and Special Applications,* vol. 346 International Society for Optical Engineering (May 6–7, 1982).

McGraw Hill Dictionary of Scientific Terms, 4th Ed., p1921 (Date Not Available).

Semiconductor Integrated Circuit Processing Technology, Runyan & Bean, p. 121–123 1990.

Dicitionary of Electronics, Radio Shack, p. 600 (1974–75).

Electronic Materials Handbook, vol. 1, Packaging, p. 1159 (Date not available).

Thin–Film Cracking and Wire Ball Shear in Plastic Dips Due to Termperature Cycle and Thermal Shock, 25th annual proceedings, pp 238–249, 1987.

* cited by examiner

HDI LAND GRID ARRAY PACKAGED DEVICE HAVING ELECTRICAL AND OPTICAL INTERCONNECTS

FIELD OF THE INVENTION

The present invention relates to the field of packaged integrated circuit devices. More specifically, the present invention relates to a high density interconnect land grid array package (HDIP) having electrical and optical interconnects.

BRIEF DESCRIPTION OF THE DRAWINGS

The novel features believed characteristic of the invention are set forth in the appended claims. The invention itself, however, as well as other features and advantages thereof, will be best understood by reference to the detailed description, read in conjunction with the accompanying drawings, wherein:

FIG. 7 shows the packaged device attached to a printed wiring board.

BACKGROUND OF THE INVENTION

The electronics industry is constantly demanding improved packaging for semiconductor devices. The demand is for packaging of reduced size and packaging that optimizes the operational speed of semiconductor devices. As the speed of semiconductor devices continues to increase, especially into the Ghz range, there will be an ever increasing demand for packaged devices that can accommodate both electrical and optical signals.

One requirement of desired packaging is that it must manage thermal requirements that are driven by the heat generated by the semiconductor devices. Another requirement of desired packaging is adaptability to the constant reduction in the size of the semiconductor device and the final electronic system of which the packages are a part. As a result, packages must optimize heat dissipation while displacing minimal volume when assembled into an electronic system.

Yet another requirement for the optical interconnection between a semiconductor device having an optical detector and/or transmitter and an optical waveguide on a printed wiring board (PWB) or another packaged semiconductor device is that the connection should not require an additional connector (such as another optical waveguide) and the alignment process should be relatively simple.

An additional requirement is that packaging design and material selection should support the reduction of assembly process defects and not require new assembly capital and tooling.

Figure 1:
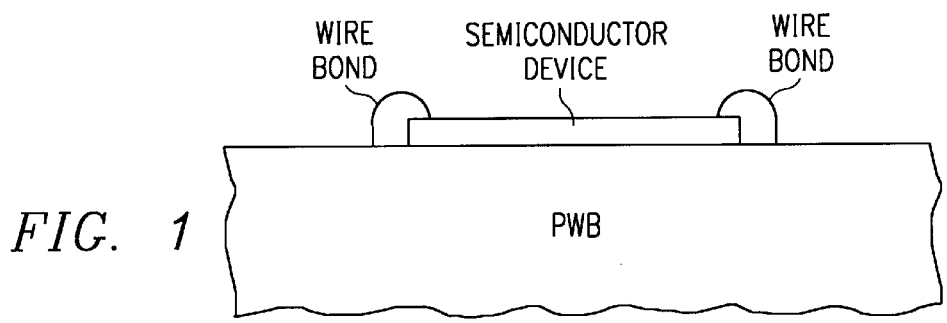
FIG. 1 is a side view of a semiconductor device attached and wire bonded to a surface of a printed wiring board.

One method of reducing the physical area required by packaged devices is shown in FIG. 1. An unpackaged semiconductor device is attached, and wire bonded, directly to the printed wiring board (PWB). A protective overcoat of glue or epoxy (not shown) is then formed over the semiconductor device, wire bonds and the corresponding portion of the surface of the printed wiring board.

The advantage of this method is the reduction in physical area required by the unpackaged semiconductor device, as compared with a packaged device. One disadvantage is that the wire bonds are long and unsupported and susceptible to bending, breaking or shorting throughout the fabrication process. Another disadvantage is that the majority of the heat generated by the integrated circuit during normal operation must be dissipated through the printed wiring board. Since most glues or epoxies are poor conductors, heat transfer is inhibited if the printed wiring board design does not have special thermal management features. Yet another disadvantage is that this technique is only applicable to semiconductor devices with relatively few bond pads, due to device and assembly yield and the limited PWB design feature sizes.

Still another disadvantage is that any optical interconnection between the semiconductor device and the printed wiring board (PWB) would require additional interconnecting optical waveguides between the top of the semiconductor device and the PWB. Each optical waveguide would have to be individually aligned. These optical waveguides would also be unsupported prior to a glue or epoxy overcoat being applied, allowing the possibility of the optical waveguides being broken, kinked or twisted.

Figure 2:
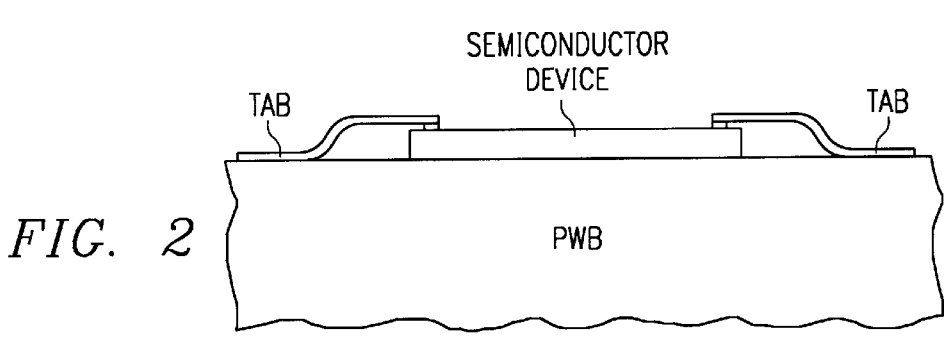
FIG. 2 is a side view of a semiconductor device attached to the surface of a printed wiring board. A Tape Automated Bonded (TAB) package electrically connects the semiconductor device to the printed wiring board.

Another method of reducing the physical area required by packaged devices is shown in FIG. 2. A tape automated bonded (TAB) packaged semiconductor device is attached directly to the printed wiring board (PWB). A TAB package is used in place of wire bonds to electrically connect the semiconductor die to the printed wiring board. A protective overcoat of a polymer or a plastic lid (not shown) is then formed over the semiconductor device, TAB package and the corresponding portion of the surface of the printed wiring board. As with the device of FIG. 1, an advantage of this method is the reduction in physical volume required by the unpackaged semiconductor device, as compared with a conventional lead frame packaged device. Advantages of using TAB over wire bonds include superior electrical performance, more physical stability and less lead breaking or shorting.

A disadvantage of the device of FIG. 2 is that the tabs are long and remain susceptible to bending, breaking and occasional shorting throughout the fabrication process. Another disadvantage, as previously discussed for the device of FIG. 1, is that the majority of the heat generated by the integrated circuit during normal operation must be dissipated through the printed wiring board. Yet another disadvantage is that any optical interconnection between the semiconductor device and the printed wiring board (PWB) would require additional interconnecting optical waveguides between the top of the semiconductor device and the PWB. Each optical waveguide would have to be individually aligned. These optical waveguides would also have to withstand handling during assembly, which presents the possibility of the optical waveguides being broken, kinked or twisted.

Figure 3:
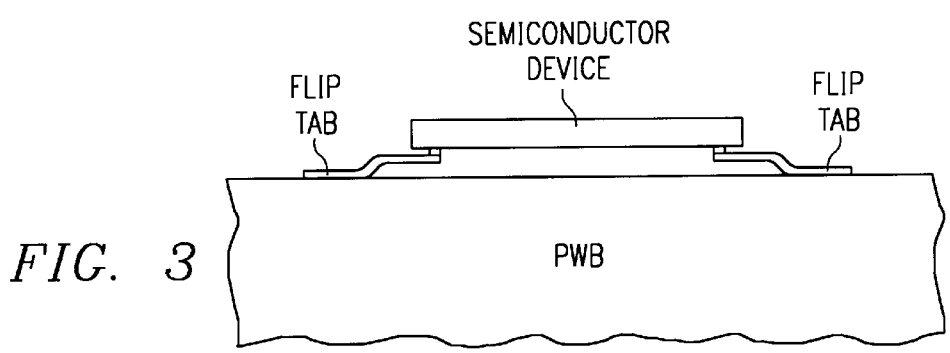
FIG. 3 is a side view of a semiconductor device mechanically and electrically attached to a printed wiring board via a flip TAB package.

Still another method of reducing the physical area required by packaged devices is shown in FIG. 3. This method is similar to that described above and shown in FIG. 2, except that the semiconductor device is face down verses face up. By the device being face down, the TAB leads are shorter and typically do not fan out from the center of the device to a large radius. This shortened package lead length will allow improved electrical signal characteristics. This reduced lead length requires the center to center spacing of each lead to adjacent lead to be small. So, the assembly of the package is significantly complicated. All TAB packages require non-conventional assembly equipment, but flip TAB requires further development of this equipment if cost effective assembly is to occur. Heat transfer may be achieved via a heat sink assembled to the TAB package and enhanced with thermal grease. The thermal grease is applied at the interface between the TAB package and the heat sink.

The device in FIG. 3 is facing down which allows the optical signal in the wave guide on the PWB to address the device directly. But, the assembly process for flip TAB is not sufficiently consistent to assure alignment of the device to the wave guide.

The physical area required for a packaged semiconductor device also includes the "footprint" (area) required to accommodate the pins of a packaged device. A packaged device having a larger number of pins typically requires a larger footprint. Recent trends suggest that functions once accomplished through many devices are being consolidated into fewer and fewer devices, resulting in more complex semiconductor devices having more pins and corresponding larger footprints. These complex semiconductor devices can be connected to the printed wiring board (PWB) as shown in FIGS. 1–3, but such connection schemes do not fully address the problems of heat dissipation or achieving the desired reduction of PWB surface area.

Figure 4:
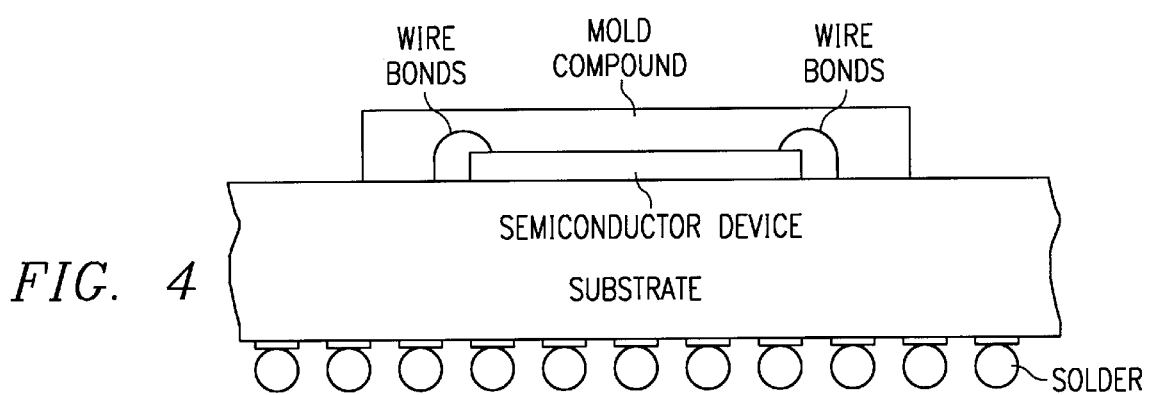
FIG. 4 is a side view of a semiconductor device attached to a Ball Grid Array interconnect scheme to reduce the footprint of the semiconductor device's package.

A method that reduces a semiconductor device's foot print is shown in FIG. 4. A semiconductor device is attached to the top surface of a substrate (small printed circuit board). The semiconductor device is wire bonded to bond pads (not shown) on the top surface of the substrate. Mold compound is then formed over the semiconductor device, wire bonds and corresponding top surface of the substrate. The bond pads on the top surface of the substrate are electrically connected to larger bond pads on the bottom surface of the substrate via internal circuitry and plated through holes in the substrate. There are multiple rows or an array of bond pads along the bottom surface of the substrate (not shown) which reduces the area of the device's footprint. Typically, there are no electrically functional bond pads within the area of the bottom surface opposite the perimeter of the semiconductor device to utilize this area for heat dissipation (not shown). Each lower bond pad then receives a solder ball. The completed device is then positioned and aligned over corresponding bond pads on a printed wiring board (not shown), after which infrared, vapor phase or convection reflow is used mechanically and electrically connect the substrate to the printed wiring board (not shown).

A reduction in foot print size and the ability to utilize existing assembly equipment are the main advantages of the device of FIG. 4. The disadvantages of the device include inadequate heat dissipation and the thick substrate. Heat dissipation is a problem resulting from two factors. The first is that the mold compound is a poor conductor of heat. Thus, much of the heat generated by the semiconductor device must exit through the substrate (small printed circuit board). Most substrates are not designed to be good heat sinks. The heat must spread throughout the substrate. If the substrate is a poor heat conductor, metal slugs or thermal vias must be inserted in the substrate to assist in the heat dissipation. If metal slugs or thermal vias are used, they are typically placed in areas of the substrate directly below the semiconductor device which reduces the number of solder ball connections available for electrical functions. Another disadvantage of the device is the length of the internal circuitry in the substrate. This additional length seems to have a limiting affect on the speed at which the device can operate.

Still another disadvantage of the device of FIG. 4 is that any optical interconnection between the semiconductor device and the printed wiring board (PWB) would require additional interconnecting optical waveguides between the top of the semiconductor device and the substrate and additional optical interconnecting means between the optical wave guides and the printed wiring board (PWB). Each optical waveguide would have to be individually aligned with the semiconductor device in the substrate. Each optical means would have to be individually aligned with the optical waveguides and the printed wiring board (PWB). In addition to the complexities of the alignment requirements, the optical waveguides would also be have to withstand handling during assembly, which allows the possibility of the optical waveguides being broken, kinked or twisted. Assuming a successful assembly, the optical signal would then have to be transmitted through the mold compound. This package's mold compound will have to be transparent to the optical signal and be thin to minimize energy loss. The optical transmission and minimal thickness of this package will be less than desirable.

Figure 5:
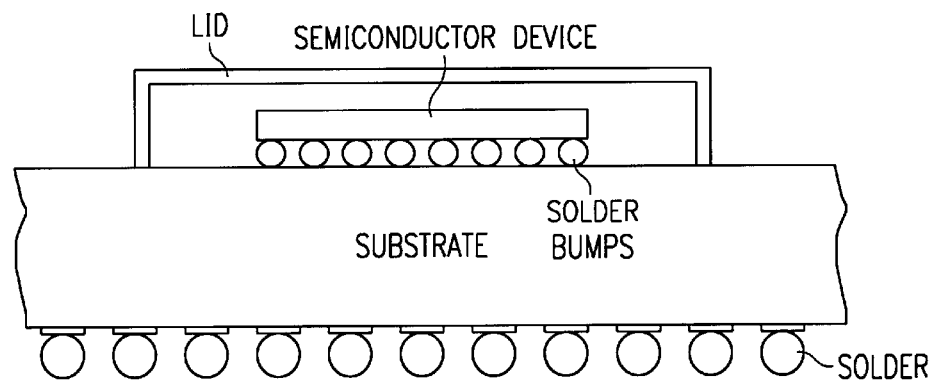
FIG. 5 is another side view of a semiconductor device attached to a Ball Grid Array interconnect scheme to reduce the footprint of the semiconductor device's package.

Another method that reduces a semiconductor device's foot print not requiring optical interconnection is shown in FIG. 5. A semiconductor device has solder balls attached to its bond pads. The semiconductor device is inverted and positioned opposite corresponding bond pads on the top surface of a substrate (small printed circuit board). Heat is applied to the semiconductor device and substrate until the solder melts, electrically and mechanically connecting the semiconductor die to the substrate. Thermal grease is then deposited over the semiconductor device after which a lid is placed over the thermal grease, semiconductor die and corresponding areas of the top surface of the substrate. As with the device of FIG. 4, the bond pads on the top surface of the substrate are plated through to larger bond pads on the bottom surface of the substrate. There are multiple rows or an array of lower bond pads along the bottom surface of the substrate (not shown) which reduces the area of the device's footprint as compared to devices with the traditional tabs or lead frames.

Typically, there are no electrically functional bond pads within the area of the bottom surface opposite the perimeter of the semiconductor device since this area is used for heat dissipation (not shown). Each lower bond pad then receives a solder ball. The completed device is then positioned and aligned over corresponding bond pads on a printed wiring board (not shown), and heat is applied to melt the solder to mechanically and electrically connect the substrate to the printed wiring board (not shown).

A reduction in foot print size is also the main advantage of the device of FIG. 5. The disadvantages of the device include inadequate heat dissipation, the thick substrate and the use of a potentially system contaminating grease. Heat dissipation is a problem resulting from two factors. The first is that thermal grease and the lid are not ideal conductors of heat. Thus, a portion of the heat generated by the semiconductor device must exit through the substrate. Most substrates are not designed to be good heat sinks. The heat must spread throughout the substrate. If the substrate is a poor heat conductor, metal slugs must be inserted in the substrate to assist in the heat dissipation. If metal slugs are used, they are typically placed in areas of the substrate directly opposite the semiconductor device, thus reducing the number of available connections for the electrical signal. Another disadvantage of the device is the length of the internal circuits in the substrate. This additional length seems to have a limiting affect on the speed at which the device can operate. The technology depicted in FIG. 5 also requires the semiconductor device to have array bond pads rather than conventional perimeter pads. This significantly limits the number of semiconductor devices available to be packaged with this technique.

Still another disadvantage is that any optical interconnection between the semiconductor device and the printed wiring board (PWB) would require additional interconnecting optical waveguides between the top of the semiconductor device and the substrate and additional optical interconnecting means between the optical wave guides and the printed wiring board (PWB). Each optical waveguide would have to be individually aligned with the semiconductor device in the substrate. Each optical means would have to be individually aligned with the optical waveguides and the printed wiring board (PWB). In addition to the complexities of the alignment requirements, the optical waveguides would also be have to withstand handling during assembly, which allows the possibility of the optical waveguides being broken, kinked or twisted. Assuming a successful assembly, the optical signal would then have to be transmitted through the mold compound. This package's mold compound will have to be transparent to the optical signal and be thin to minimize energy loss. The optical transmission and minimal thickness of this package will be less than desirable.

Figure 6:
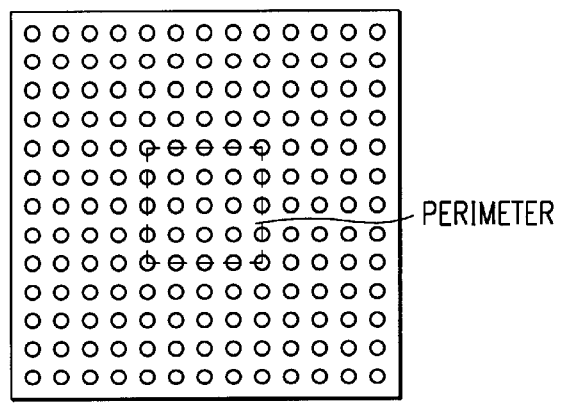
FIG. 6 is a bottom view of the device of FIG. 4 or FIG. 5.

FIG. 6 shows one example of a bottom view of the substrate of the devices of FIGS. 4 and 5. The solder balls are formed in rows as previously discussed. Even if there are solder balls within the area opposite the perimeter of the semiconductor device, they typically are not electrically functional.

The devices of FIGS. 1–3 address the industry requirement of reducing packaging size. But none of the devices adequately addresses the heat dissipation problem or the problem of reducing the foot print of increasingly larger and complex semiconductor devices, or the problems of optically interconnecting a semiconductor device to a printed wiring board or to another semiconductor device. The devices of FIGS. 4–5 address the industry requirement of reducing the foot print of a semiconductor device over traditional foot prints, but they do not adequately address heat dissipation problems, high frequency electrical performance problems or problems of optically interconnecting a semiconductor device to a printed wiring board or to another semiconductor device. In addition, the physical size limitations of the substrates required by the devices of FIGS. 4–5, hinders further reduction of the overall packaged device size. For example, for the package in FIG. 4 to be designed with the solder balls on an array pitch below 1.5 mm, the substrates plated through holes diameter and circuit width will have to be reduced. This reduction of substrate feature sizes will reduce its manufacturability.

Thus, there remains a need for a packaging technique that provides a very thin, electrically and thermally high performance package for single or multiple semiconductor devices that also facilitates optical interconnection between a semiconductor device and a printed wiring board or another packaged semiconductor device.

SUMMARY OF THE INVENTION

The present invention disclosed herein comprises a high density interconnect land grid array package that combines various electronic packaging techniques in a unique way to create a very thin, electrically and thermally high performance package for single or multiple semiconductor devices that also facilitates optical interconnection between a semiconductor device and an optical wave guide, another semiconductor device, or any source of an optical signal.

In one embodiment of the invention, a thin and mechanically stable substrate or packaging material is selected that also has high thermal conductivity. Cavities in the substrate or packaging material accommodate one or more semiconductor devices that are attached directly to the substrate or packaging material. At least one of the one or more semiconductor devices will also have optical receivers and/or transmitters. A thin film overlay, having multiple layers, interconnects the one or more semiconductor devices to an array of pads on the surface of the thin film overlay facing away from the substrate or packaging material. Solder balls, conductive adhesive or elastomeric connectors are attached to the pads to provide electrical and mechanical attachment means to other system hardware. The optical receivers and/or transmitters do not require any additional physical connection. The light signals exchanged between the optical receivers and/or transmitters and the optical receivers and/or transmitters on a printed wiring board or another package semiconductor device should be able to penetrate the thin film overlay as long as the electrical conductors of the thin film overlay are not located between the respective receivers/transmitters. An alternate embodiment of the invention provides that a laser beam or other suitable means be used to bore a hole through the surface of the thin film overlay to the receivers and/or transmitters. Optical quality material may be used to back fill the hole.

A high density interconnect land grid array package (HDIP) is smaller, thinner, electrically faster, with higher heat dissipation characteristics than traditional packaged devices. The HDIP is smaller because the thin film overlay and the land grid array allow the package to have a smaller foot print as compared to existing packaged devices. Present HDIP technology allows for the use of semiconductor devices with peripheral either bond pads down to a 50 micron center to center pitch or bond pads that are in an array format on the device.

The HDIP is thinner than existing packaged devices because one or more semiconductor devices are placed in cavities in a substrate or packaging material that is thin, mechanically stable and having high thermal conductivity. The HDIP is faster because the distance of the electrical path between the semiconductor device or devices and the solder balls or other conductive means is shorter than the distances of the electrical paths of existing devices. The land grid array device has higher heat dissipation characteristics than existing devices because the device is directly attached to the package's external material. Thus, the number of layers of material and total thickness of packaging that the heat must travel from a semiconductor device to the air is minimized. In addition, a heat sink may be added to the substrate or packaging material to increase heat dissipation.

The HDIP is also an efficient method of interconnecting an optical transmitter and/or receiver in a packaged semiconductor device to similar optical means on a printed wiring board or another packaged semiconductor device. No additional optical means are required for interconnection. In addition, the land grid array device is easy to align since the solder balls, bumps or electrical pads may be used to align the package.

High density interconnect land grid array package technology, according to the invention, is adaptable to a wide range of electronic packaging applications. The elimination of wire bonds or TAB attachment solder joints should result in higher packaged device reliability and potentially lower cost because of reduction in manufacturing and assembly process steps.

DETAILED DESCRIPTION OF THE INVENTION

Figure 7:
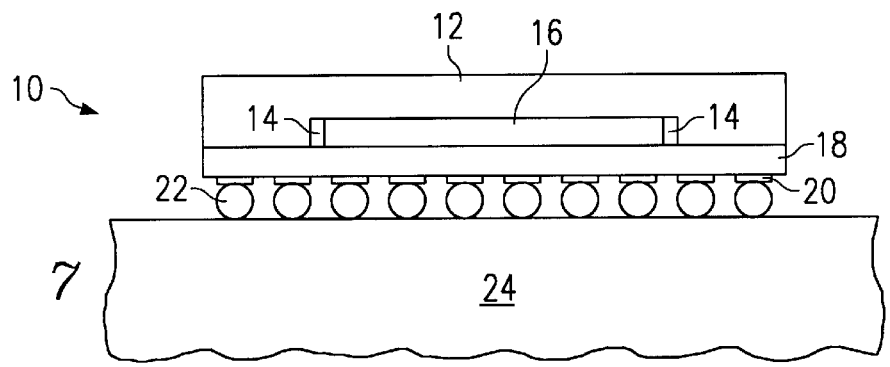
FIG. 7 is a side view of an HDI land grid array package device according to one embodiment of the invention.

FIG. 7 discloses a high density interconnect land grid array package (HDIP), generally at 10. The size and shape of HDIP 10 is merely descriptive for the purposes of this application. In practice, HDI land grid array package devices 10 will exist in various sizes and shapes.

HDIP 10 includes a substrate or packaging material 12 having a cavity 14 that accommodates semiconductor device 16. The surface of semiconductor device 16 having pads for electrical connection (not shown) and at least one optical receiver and/or transmitter, faces away from cavity 14. The pads of semiconductor device 16 are connected through a thin film overlay 18 to an array of pads 20 on the bottom surface of thin film overlay 18. An optical waveguide 23 in printed wiring board 24 is in mechanical and optical alignment with a respective optical receiver/transmitter (not shown) in semiconductor device 16. In the embodiment of the invention shown in FIG. 7, a solder ball 22 is formed on each bond pad 20, resulting in a completed device. Infrared, convention or vapor phase reflow is then used melt solder balls 22 sufficient to mechanically and electrically connect each pad 20 to a corresponding pad (not shown) on printed wiring board (PWB) 24.

The electrical path through HDI land grid array package device 10 begins with the signal coming off printed wiring board (PWB) 24, after which the signal travels through solder balls 22, through signal pathways in thin film overlay 18 and into semiconductor device 16. A signal returning to printed wiring board (PWB) 24 propagates through this sequence in reverse order. A path through thin film overlay 18 is the shortest and fastest path possible for a packaged semiconductor device. Moreover, thin film overlay 18 may be designed to accommodate special electrical requirements, for example high speed transmission lines, by adding electrically protective signals and/or layers in the thin film overlay. The primary thermal path for the semiconductor device 16 is to the air which is very short because the semiconductor device 16 is attached directly to the substrate or packaging material 12. The secondary path is through the thin film overlay 18, through the solder balls 22 and into the PWB 24. This thermal path may be enhanced with the addition of a heat sink (not shown) to the substrate or packaging material 12.

The optical path through HDI land grid array package device 10 begins with the optical signal coming off optical waveguide 23 which is in the surface of printed wiring board 24 or other similar means. Optical waveguide 23 makes a turn to align vertically with the bottom surface of semiconductor device 16. No additional optical connection means are necessary since optical wave guide 23 faces a receiver/transmitter in semiconductor device 16. The optical signal comes off optical waveguide 23, after which the optical signal travels through thin film overlay 18 and into semiconductor device 16. The light signal (i.e. at 3 Ghz) may be processed at its received speed or ramped down to a lower frequency (i.e. to 48 Mhz).

A method of making HDIP 10 is shown in FIGS. 8–22. The method begins with the selection of a substrate or packaging material made of ceramic, aluminum nitride, molded plastic, compound molded plastic, flex circuit/molded plastic, PWB laminate, metal, artificial diamond, a combination of one or more of these materials or other similar types of material. The substrate or packaging material must be thin, mechanically stable and have high thermal conductivity. The substrate or packaging material may also be formed with heat slugs to facilitate heat dissipation.

Figure 8:
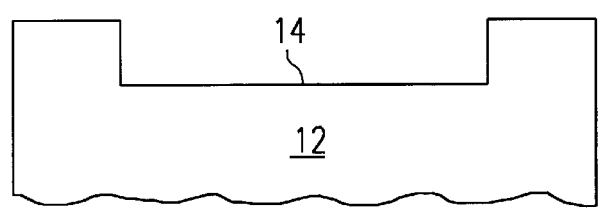
FIGS. 8–22 are successive process steps for a method of making a device according to one embodiment of the invention.
Figure 9:
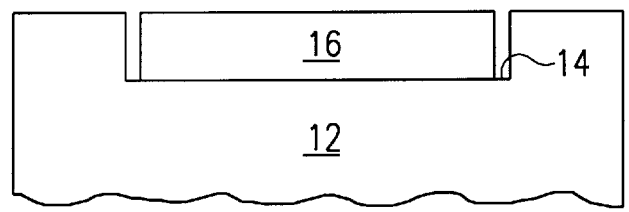

Once a substrate or packaging material 12 has been selected, a cavity 14 is formed or milled out in material 12, as shown in FIG. 8, to a dimension slightly larger than the semiconductor device. Next, a semiconductor device 16, having at least one optical transmitter and/or receiver, is positioned manually or by machine (i.e. pick and place machine) within cavity 14, as shown in FIG. 9. Semiconductor device 16 is secured within cavity 14 of substrate 12 by adhesive or other similar means. If adhesive material is used, the die attach material may have a high or low modulus of elasticity, be thermally conductive or non-conductive and electrically conductive or non-conductive depending on the die characteristics and system end use application. The adhesive material may or may not fill the gap between the edge of the semiconductor device 16 and the cavity 14 depending on the desired separation of the semiconductor device material from the substrate material. The surface of semiconductor device 16 opposite cavity 14 should contain the bond pads of the die and be flush with the surface of substrate 12 having the cavity formed therein to facilitate the formation of a thin film overlay (not shown).

Figure 10:
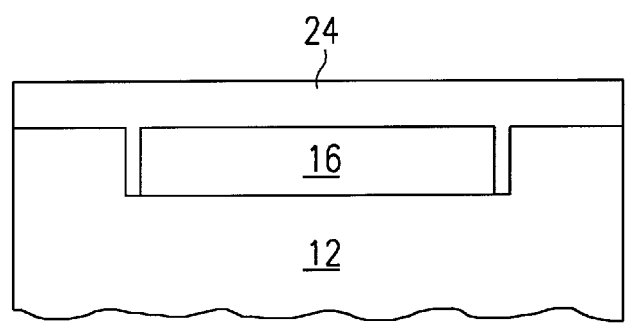
Figure 11:
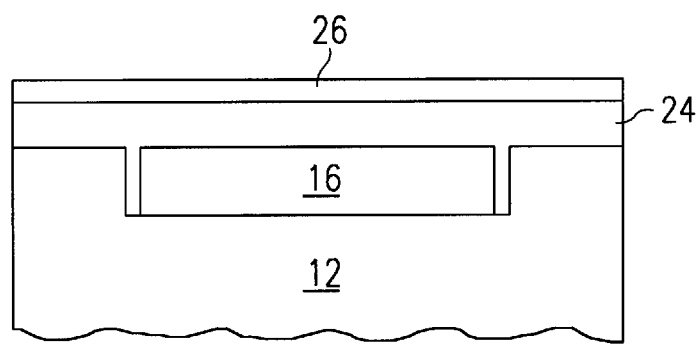

Next, a layer of dielectric material 24 is formed or deposited over the entire substrate/die subassembly, shown in FIG. 10. The dielectric material selection may include liquid resin and/or films or combinations of these materials. Polyetherimide (G.E. brandname ULTEM) is but one material that may be used as an effective dielectric for layer 24. The method of application may also vary from applying and curing a liquid to placing down a sheet of film and laminating. The film may be a thermal plastic or thermal set material. An optional step at this point would be the formation of a polymer layer 26 over dielectric layer 24, as shown in FIG. 11. Thus, if dielectric layer 24 is a layer of polyetherimide, an acceptable material for polymer layer26 would be a polyimide material (DuPont brandname KAPTON). A combination of material 24 and 26 (for example, material 24 coated on material 26 film) into one piece of material is an alternative to separate sheets of material or liquid resins.

Figure 12:
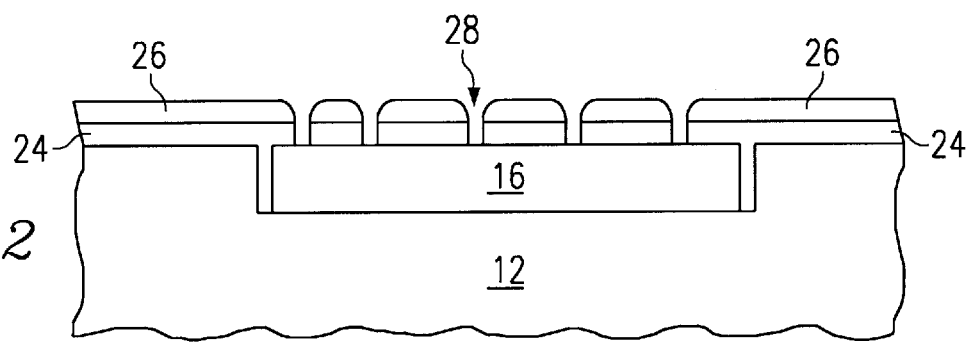
Figure 13:
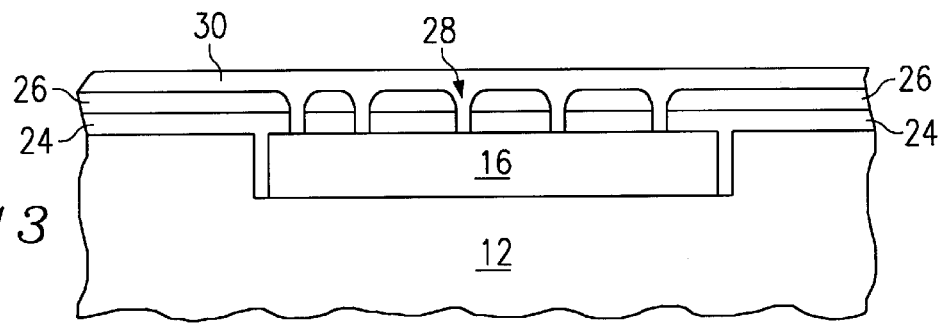
Figure 14:
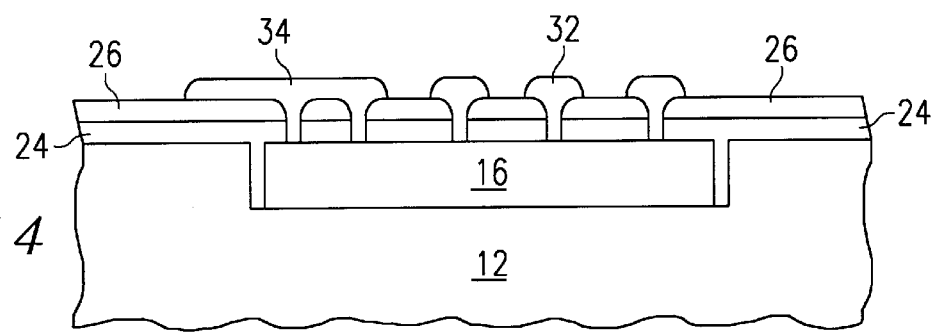

The next step requires the construction of vias 28 through any layer or layers above dielectric layer 24, (e.g. optional polymer layer 26), through dielectric material 24 and down to the bond pads of semiconductor device 16, as shown in FIG. 12. Ablation (e.g. with a laser), chemically with a liquid, a gas or a plasma or by other suitable means may be used to form vias 28. Next, a metallization layer 30 is deposited or formed on top of dielectric layer 24 (on top of polymer layer 26 if optional layer used) and into vias 28, as shown in FIG. 13. If deposition is used, deposition may be performed with standard HDI dry deposition techniques or any other material deposition techniques. A typical metallization material may be sequential layers of metal such as titanium, copper and titanium. Imaging and photolithography processes are then performed on metallization layer 30, resulting in metallized pads 32 (only three shown) and metallized planes or circuits 34 (optional) (only one shown), as shown in FIG. 14. The resulting pattern with its varied number and location of metallized pads 32 and metallized planes or circuits 34 can be designed to adapt to different semiconductor device and package orientation requirements.

Figure 15:
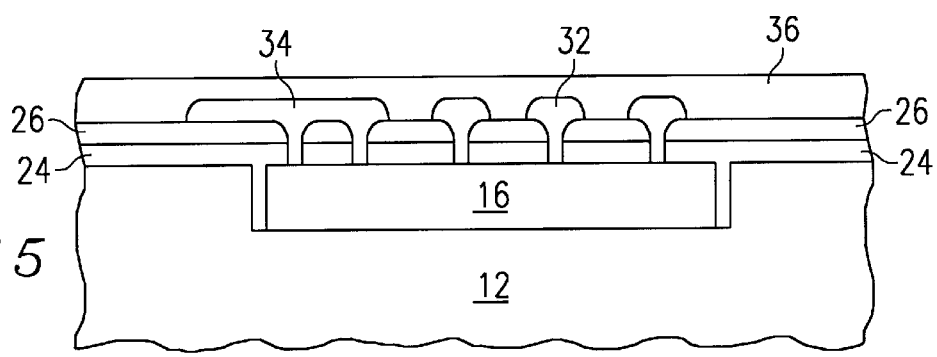
Figure 16:
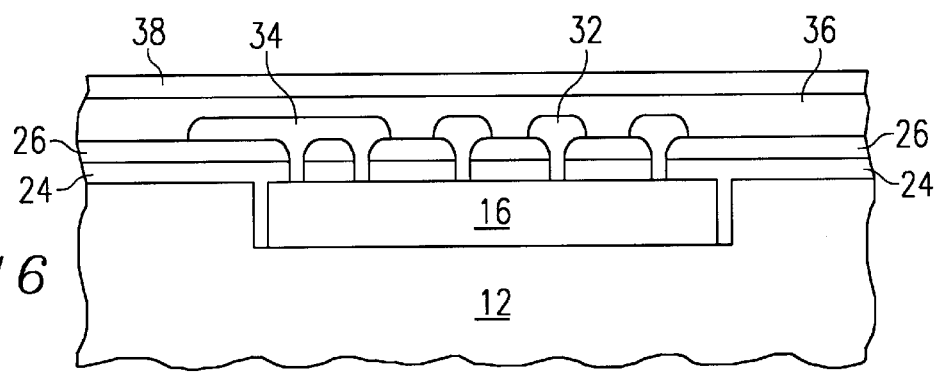

The steps of forming or depositing dielectric layer 24 through the patterning of metallization layer 30 may be repeated, beginning with the forming or depositing of a dielectric layer 36 on top of patterned metallization layer 30, as shown in FIG. 15, as necessary to build a thin film overlay 18 with the required number of layers. As stated previously, the dielectric material selection may include liquid resin and/or films or combinations of these materials. The method of application may also vary from dispensing and curing a liquid to placing down a sheet of film and laminating. An optional step at this point would be the formation of a polymer layer 38 over dielectric layer 36, as shown in FIG. 16. Thus, if dielectric layer 36 is a layer of partially cured polyimide resin, an acceptable material for polymer layer 38 would be a fully cured sheet of polyimide material. A combination of material 36 and 38 into one piece of material is an alternative to separate sheets of material or liquid resins.

Figure 17:
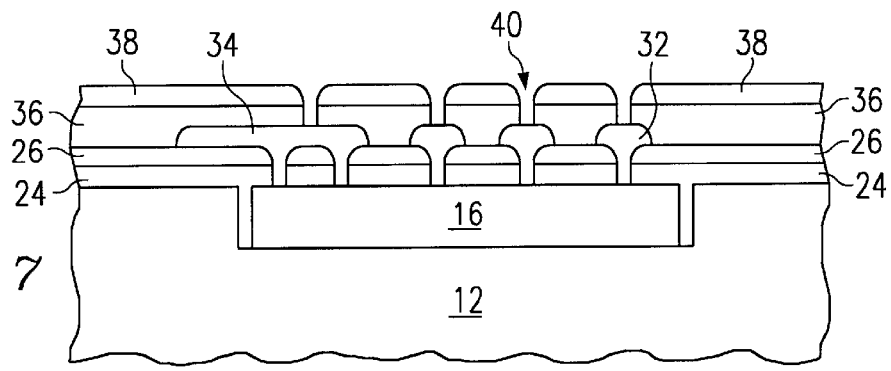
Figure 18:
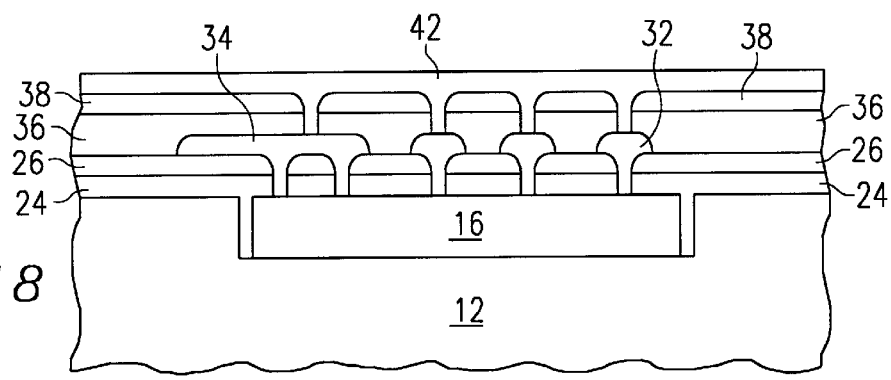
Figure 19:
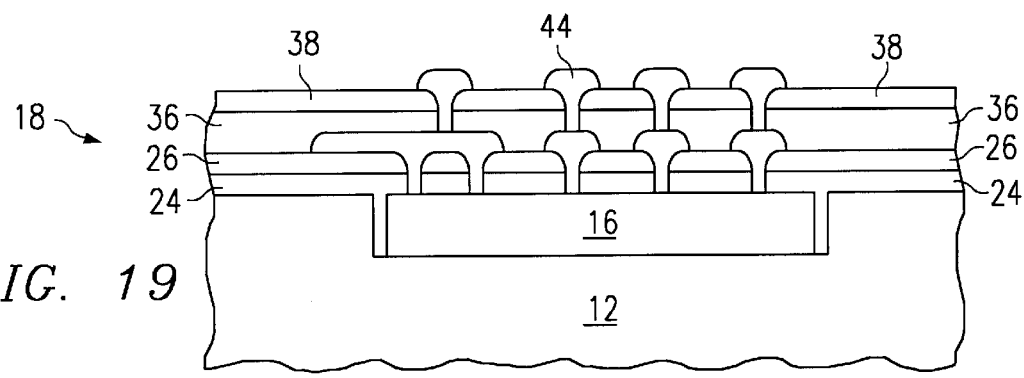

The next step requires the construction of vias 40 through any layer or layers above dielectric layer 36, (e.g. optional polymer layer 38), through dielectric layer 36 and down to metallized pads 32 and planes 34 (if any), as shown in FIG. 17. Next, a metallization layer 42 is deposited or formed on top of dielectric layer 36 (on top of polymer layer 38 if optional layer used) and into vias 40, as shown in FIG. 18. If deposition is used, deposition may be performed with standard dry deposition techniques or any other material deposition techniques. Imaging and photolithography processes are then performed on metallization layer 42, resulting in metallized pads 44 (only four shown) and metallized planes (if any), as shown in FIG. 19. The resulting pattern with its varied number and location of pads 44 and planes (if any) can be designed to adapt to different semiconductor device and package orientation requirements. FIG. 19 also shows thin film overlay generally at 18, which is not to scale. In practice, thin film overlay 18 will usually be much smaller in height as compared to semiconductor device 16 and substrate or packaging material 12.

Figure 20:
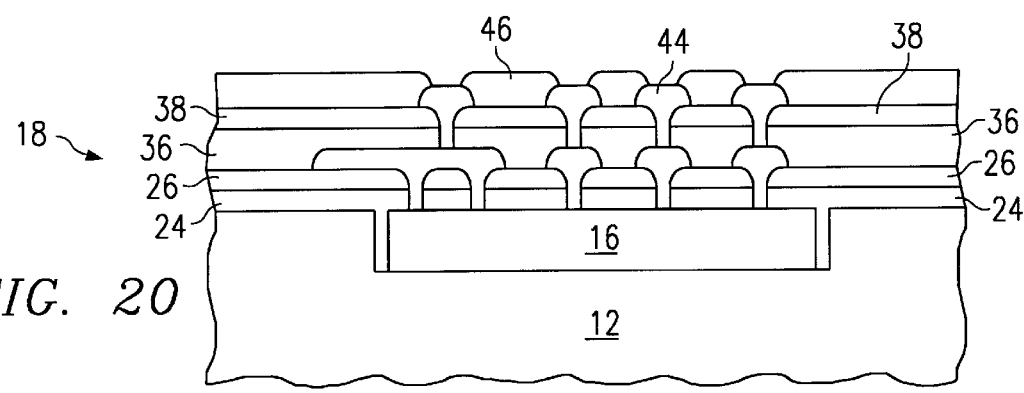
Figure 21:
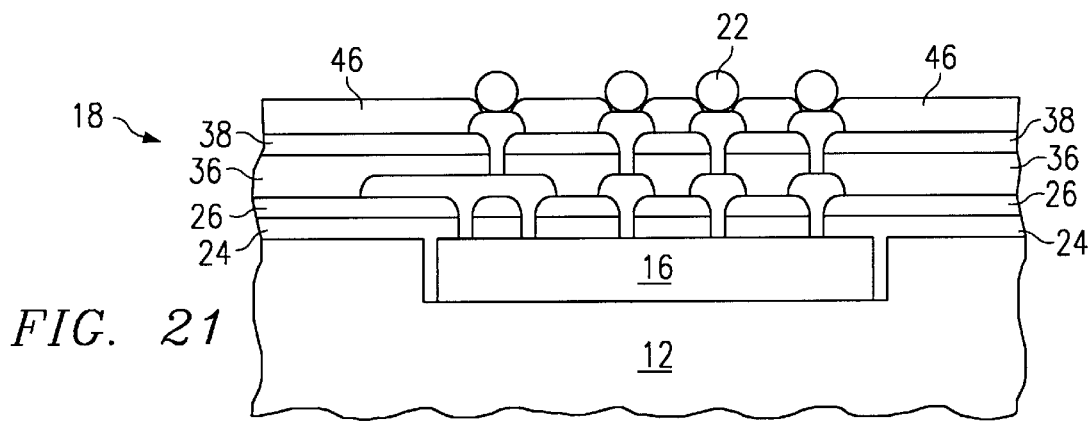
Figure 22:
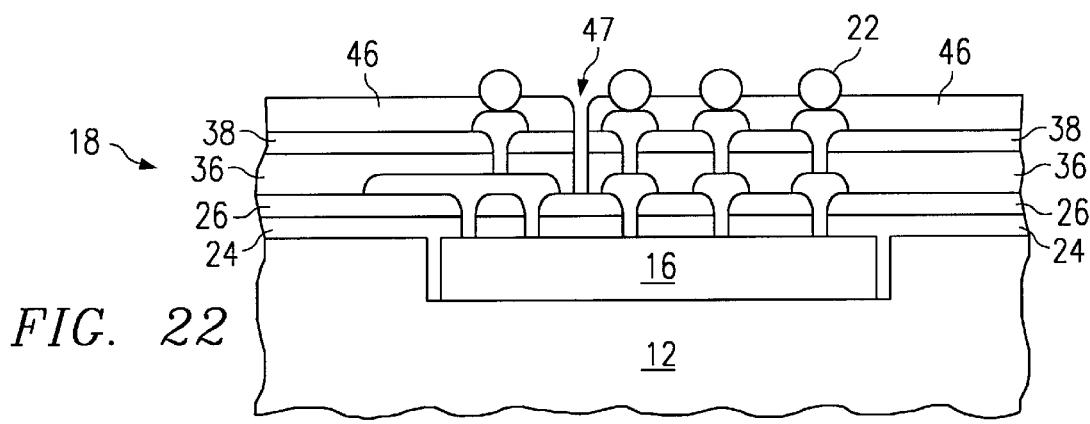

The steps beginning with forming or depositing a dielectric layer and ending with the patterning of a metallization layer may be repeated as necessary to build a thin film overlay 18 with the required number of layers. After the last metallization layer is patterned, the metallized pads of the last metallization layer are prepared for an appropriate connection means. The connection means may be solder ball, metal bump or polymer connection. If solder balls are too be used, the surface of the metallized pads should be plated in preparation for the solder ball attachment. The plating may be tin/lead, nickel, gold, other metals or combinations of metals amenable to good electrical and mechanical contact. A solder mask 46 (i.e., 1 mil thick epoxy based polymer) may also be formed at this time over the top of layer 38 exposing only metallized pads 44, as shown in FIG. 20. Solder balls 22 are attached to the metallized pads, as shown in FIG. 21.

At this point, as an aid to optical communications, a hole 47 may be formed through at least layer 46 with a laser beam or other similar means, directly above an optical receiver and/or transmitter on the surface of semiconductor device 16. If necessary, the hole may be lengthened through one or more of layers 38, 36, 26 and 24, down to the surface of an optical receiver and/or transmitter on the surface of semiconductor device 16, as shown-in FIG. 23. The hole may be left open or back filled with a material that facilitates optical interconnection between semiconductor device 16 and an optical wave guide, another semiconductor device, or any source of an optical signal.

Figure 23:
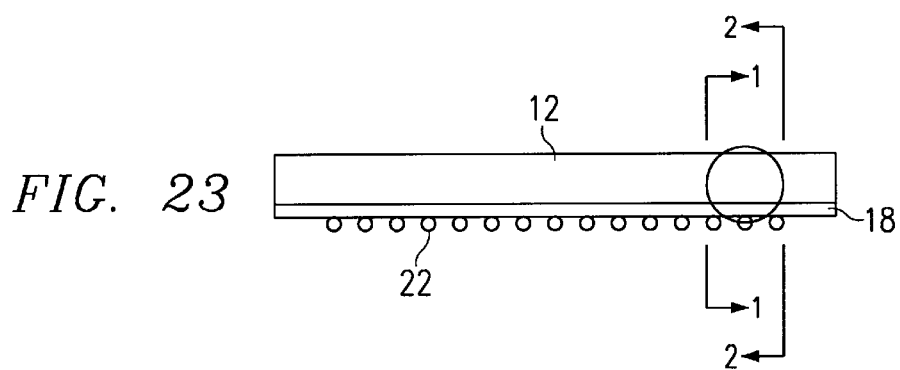
FIG. 23 is a side view of a completed device constructed according to an embodiment of the invention.
Figure 24:
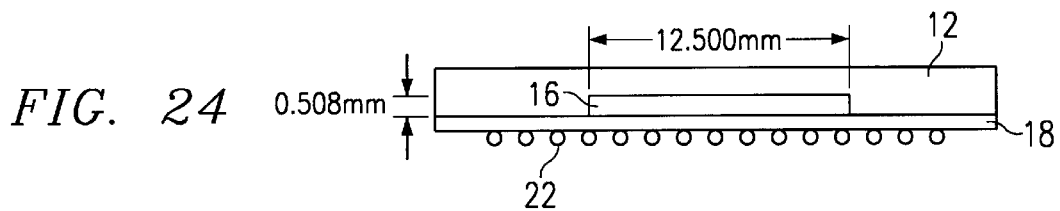
FIG. 24 is a side view of a completed device constructed according to an embodiment of the invention, including an approximate location of the semiconductor device with the substrate or packaging material.

A side view of a completed high density interconnect land grid array package (HDIP) is shown in FIG. 23. Note that thin film overlay 18 is small in height as compared to substrate or packaging material 12 and to solder balls 22. FIG. 24 is the device shown in FIG. 23 including a positional representation of semiconductor device 16.

Figure 25:
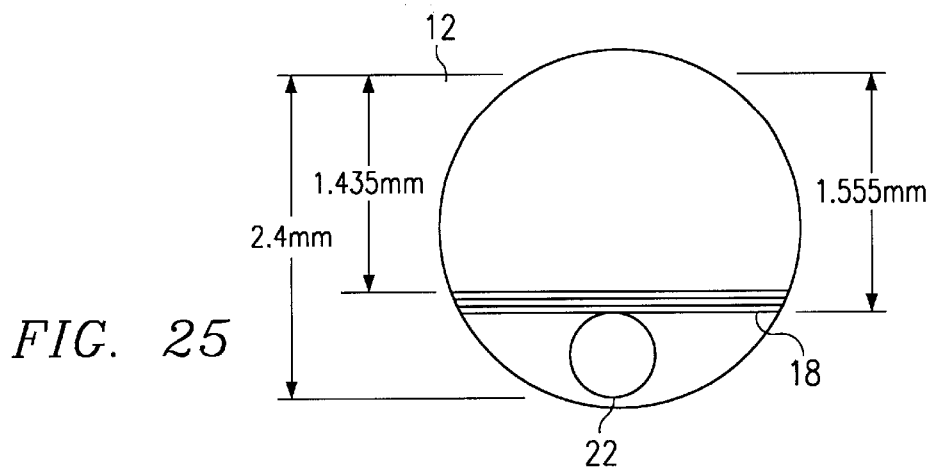
FIG. 25 is an enhanced view, in section, of the circular area defined by the reference arrows 1—1 and 2—2 in FIG. 22.

As an example, if the size of semiconductor device 16 is 12.4×12.4×0.48 (mm) and the device attach means is 0.025 (mm) of adhesive, the cavity in a substrate or packaging material of AL2O3, AL2N3, FR4 or BT resin must have a dimension of 12.5×12.5×0.505 (mm). The height between the top surface of the substrate or package (outside the cavity) and the bottom surface should be around 1.435 (mm). A thin film overlay having two metal layers would require a first dielectric layer of polyimide material 35 (um) in height, a first metal layer of Ti/Cu/Ti 4 (um) in height, a second dielectric layer of polyimide 35 (um) in height a second metal layer of Ti/Cu/Ti 4 (um) in height and a layer of solder mask material 35 (um) in height. The total height of the thin film overlay would be approximately 0.110 (mm). A solder ball of 0.6 (mm) diameter attached to a bond pad would extend the height between the top surface of the substrate or package (opposite the cavity) to the bottom of the solder ball to 2.14 (mm), as shown in FIG. 25. FIG. 25 is an enlarged cross section of the device of FIG. 23 within the circular area defined by reference arrows 1—1 and 2—2.

To facilitate a 225 pinout grid in this example, the substrate or packaging material should be about 27.0×27.0

Figure 26:
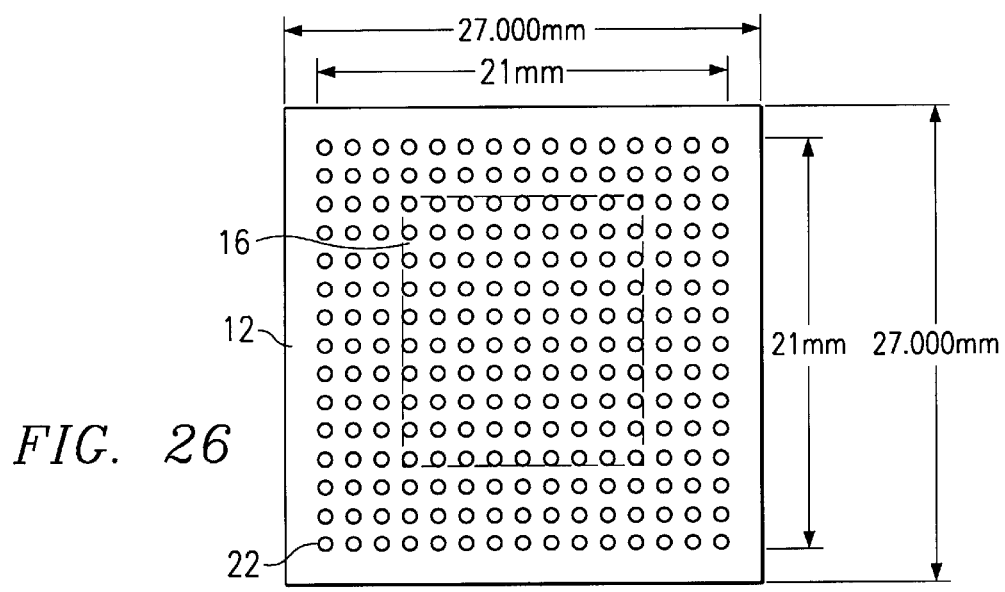
FIG. 26 is a bottom view of a device according to an embodiment of the invention.

(mm), as shown in FIG. 25. A 225 pinout grid in a 15×15 pattern would require an area 21.0×21.0 (mm) to accommodate the solder balls at a 1.5 (mm) pitch. FIG. 26 shows a bottom view of the device of FIG. 23. Note that the solder balls are arraigned in a grid pattern around and immediately beneath semiconductor device 16. Positioning signal paths and solder balls beneath semiconductor device 16 reduces the surface of the device's foot print to the theoretical minimum. And while the device of FIG. 26 has 221 (225—space for 4 optical holes) solder balls in a pattern of 15×15, both the pattern array size and solder ball to solder ball distance can be reduced or enlarged to meet just about any semiconductor device pinout requirements.

Figure 27:
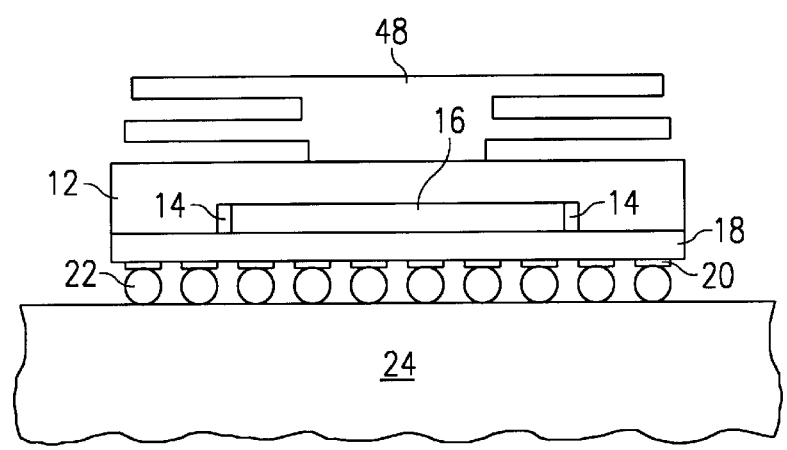
FIG. 27 is a side view of a device according to another embodiment of the invention.

In another embodiment of the invention, the thermal path from semiconductor die 16 to the air is enhanced by the addition of a heat sink 48, as shown in FIG. 27. Heat sink 48 is welded, soldered, glued, press fit or attached by any other suitable means onto substrate or packaging material 12, depending upon the composition of substrate or packaging material 12 and heat sink 48. The size and shape of heat sink 48 may be changed as needed to meet specific design heat dissipation and physical space specifications. Heat sink 48 may also be used in combination with a substrate or packaging material 12 that incorporates one or more heat slugs in the substrate or packaging material.

Figure 28:
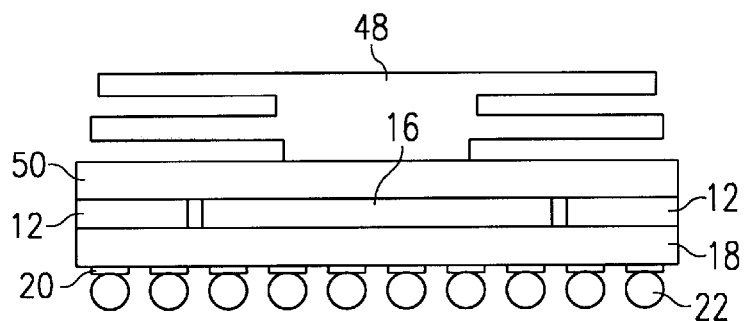
FIG. 28 is a side view of a device according to yet another embodiment of the invention.

In yet another embodiment of the invention, shown in FIG. 28, substrate or packaging material 12 is PWB laminate. Cavity 14 in substrate or packaging material 12 may be designed to expose a metal base 50 for the semiconductor device attach. The metal may be selected to customize the substrate thermal expansion rate and maximize the overall package heat dissipation characteristics. Variations of this embodiment of the invention includes material 12 to be any type of organic material, inorganic material of composites of those materials; thin film overlay 18 may be multiple layers of metal, multiple layers of metal and non-metal material; cavity 14 may be formed to various depths in the substrate material 12 and 18, for example, the cavity may not penetrate down to the surface of the metal 18 or it may partially penetrate into the metal 18.

Figure 29:
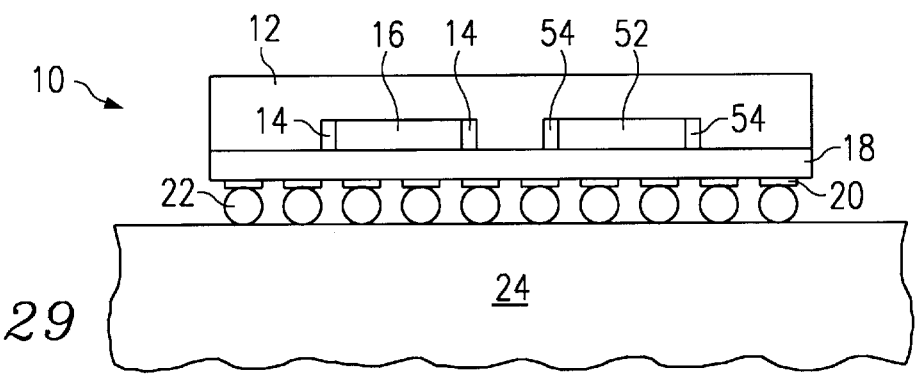
FIG. 29 is a side view of a device according to still yet another embodiment of the invention.

In still another embodiment of the invention, shown in FIG. 29, a second semiconductor device 52 is placed within substrate or packaging material 12 and connected to semiconductor device 16 and bond pads 20 by thin film overlay 18. The additional steps required supplement the methods steps previously discussed for making an HDIP having a single semiconductor device. An additional step would require the formation or milling of a second cavity 54 in substrate 12. Semiconductor device 52 would be placed in cavity 54 and secured in the same manner as semiconductor device 16. If semiconductor devices 16 and 52 are not to be interconnected, the method for forming thin film overlay 18 and any additional steps are the same as previously discussed, only expanded to include and account for semiconductor device 52. But if semiconductor devices 16 and 52 are to be interconnected, an additional step may require that thin film overlay 18 be modified to include some metal layer interconnection between the two semiconductor devices as well.

A HDIP can also be expanded to include more than two semiconductor devices (not shown). The size of the substrate or packaging material can be enlarged as necessary to hold the desired number of semiconductor devices. Additional cavities will have to be formed or milled in an enlarged substrate or packaging material for the additional semiconductor devices. If the semiconductor devices are not to be interconnected, the method for forming the thin film overlay and any additional steps are the same as previously discussed, only expanded to include and account for the additional semiconductor devices. But if some or all of the semiconductor devices are to be interconnected, at least one additional step will require that the thin film overlay be modified to include some metal layer interconnection between the semiconductor devices. Moreover, one or more of the additional semiconductor devices may have optical receivers and/or transmitters.

Figure 30:
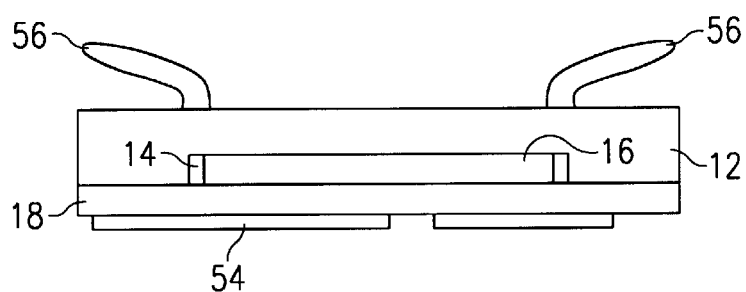
FIG. 30 is a side view of a device according to yet still another embodiment of the invention.

In still yet another embodiment of the invention, shown in FIG. 30, solder balls 22 on thin film overlay 18 are replaced with an array of metal pads 54 to accommodate pressure contact alternatives. An ideal assembly approach for this embodiment of the invention would be for the package to "snap-in" against other system hardware, (e.g. a printed wiring board) and establish electrical contact through a pressure sensitive media. To apply the necessary pressure, either the substrate would be designed with features 56, shown in FIG. 30, that would pressure load the package into the system or the system would have the pressure inducing feature (not shown). This "snap-in" feature would allow easy system hardware upgrades or a product designed for changing out packages for alternative software applications.

Figure 31:
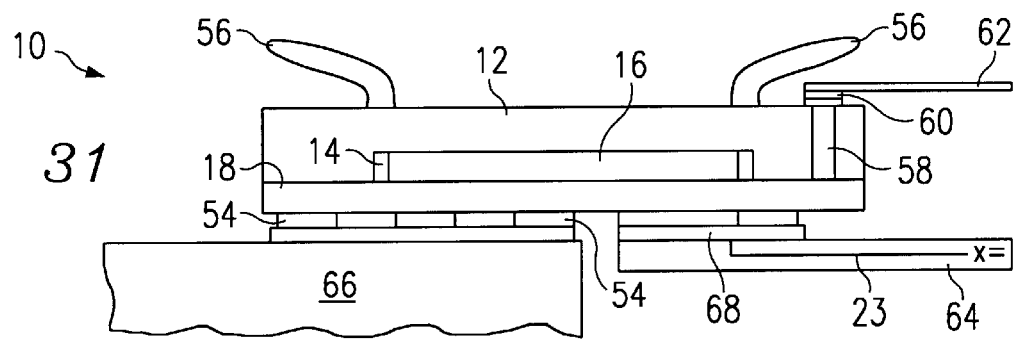
FIG. 31 is a side view of a device according to still another embodiment of the invention.

It is also possible for a conductive path 58 to be built through substrate or packaging material 12 to allow an alternative electrical path off the back side of packaged device 10, as shown in FIG. 31. Conductive path 58 could be formed by drilling a hole, by laser drill or other suitable means, through substrate or packaging material 12, the hole could then be filled with a conductive metal slug or other conductive material. A conductive pad 60, typically metal, is then formed at the end of the metal slug or conductive means on the back side of packaged device 10. The resulting device allows metal pads on either side of the module to make electrical contact to various types of hardware (i.e., a flexible PWB 62, a rigid PWB 64 or a display panel 66) through conventional solder, conductive adhesive or some type of Z-axis, electrically conductive material 68.

Figure 32:
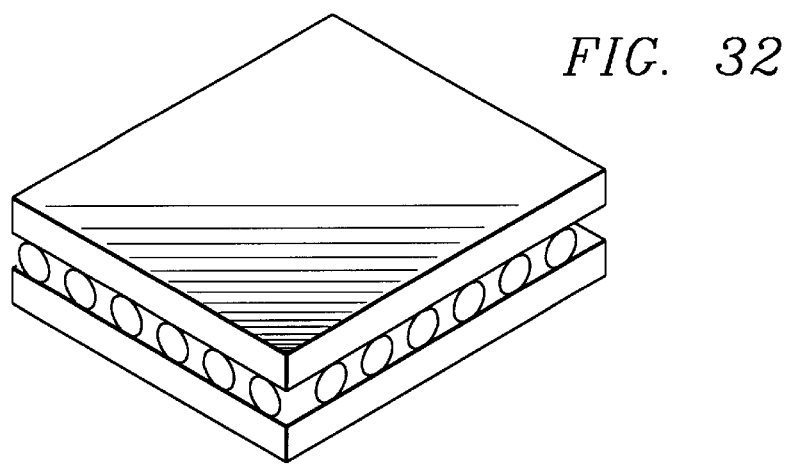
FIG. 32 is an elevational view of a pair of mated and aligned HDI packages.

FIG. 32 shows two interconnected HDI multichip packages. Each of the packages has at least one optical receiver an/or transmitter aligned with a respective optical transmitter and/or receiver of the opposing package (not shown). The solder balls are used as an alignment mechanism. Light signals will pass back and forth between the two packages.

In addition to the optical receivers and/or transmitters in the semiconductor device, (which may also include detectors and emitters, respectively), diffraction, refraction and reflection optical elements may be included within or on top of the thin film overlay to direct optical signals to the optical receivers and from the optical transmitters to an external optical source.

Figure 33:
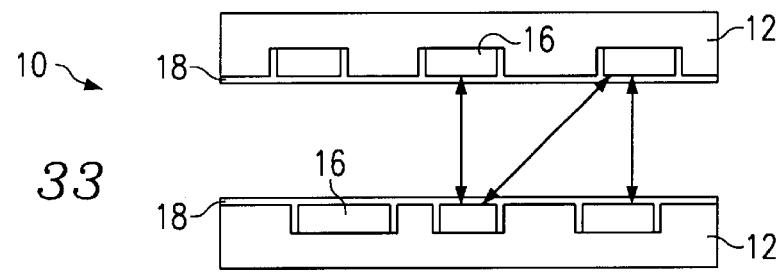
FIG. 33 is an elevational view of two optically aligned yet physically separate HDI packages.

FIG. 33 shows two HDI multichip packages utilizing optical interconnection according to one embodiment of the invention.

While this invention has been described with reference to illustrative embodiments, this description is not to be construed in a limiting sense. Various modifications to the illustrative embodiments, as well as other embodiments of the invention will be apparent to persons skilled in the art upon reference to this description. It is therefore contemplated that the appended claims will cover any such modifications or embodiments as fall within the true scope of the invention.

For example, after disclosure of the HDIP optical interconnect package described in this document, it will be obvious that variations on packages described in FIGS. 4 and 5 are possible to approach the performance of the HDIP package. These variations are depicted in FIGS. 34 and 35.

Figure 34:
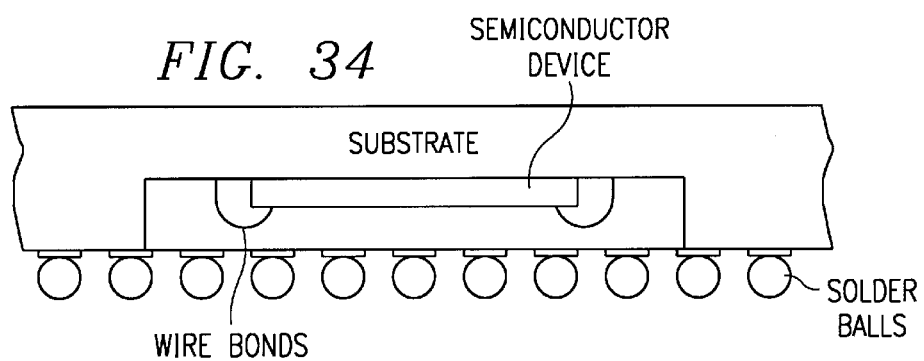
FIG. 34 is a side view of yet another embodiment of the invention.

FIG. 34, similar to FIG. 4, utilizes a PWB as the substrate, wire bond as the die attach technique, then overmolded with a transparent plastic and solder balls are attached. The thickness of the overmolding will be a disadvantage when compared to the HDIP technique and materials. Also, the package in FIG. 34 sacrifices a number of electrically functional solder ball contacts when assembled in this manner. Thermal performance, with the use of heat slugs in the PWB and assembly alignment capability will be similar to the HDIP technique.

Figure 35:
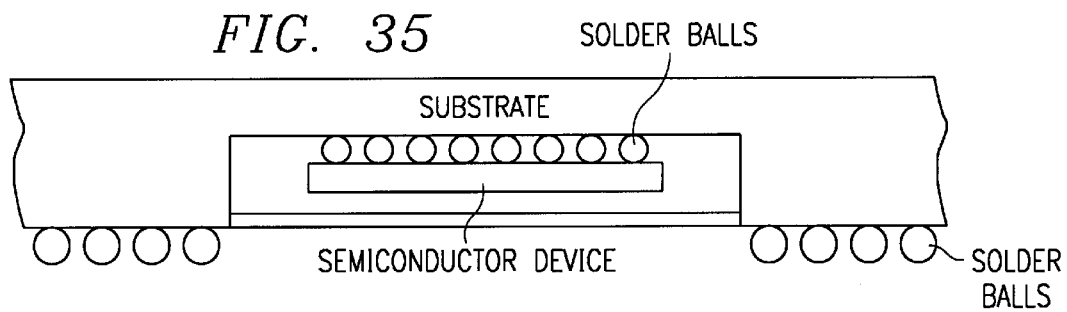
FIG. 35 is a side view of still yet another embodiment of the invention.

FIG. 35 utilizes the same material and processes as those described for FIG. 5. The lid over the face of the die will need to be optically transparent to allow for the transmission of the optical signal. The disadvantages of this technique will be thermal performance due to the thermal path being only through the ceramic instead of through the thermal grease described in FIG. 5. This design also sacrifices a number of electrically functional solder ball contacts when assembled in this manner.

What is claimed is:

1. A method, comprising:
   forming a cavity in a substrate;
   placing a semiconductor device in said cavity in said substrate, said semiconductor device having at least one optical receiver and/or transmitter adjacent a surface of said semiconductor device facing away from said substrate; and
   forming a multilayer thin film overlay on said surface of said semiconductor device and on a surface of said substrate adjacent and substantially parallel with said surface of said semiconductor device, said thin film overlay connecting bond pads on said semiconductor device to electrically conductive pads patterned in an array of continuous rows and columns on a layer of said thin film overlay facing away from said semiconductor device;
   forming a hole between said optical receiver and/or transmitter on said semiconductor device and said layer of said thin film overlay facing away from said semiconductor device; and
   back filling said hole with a material that facilitates optical interconnection between said semiconductor device and an optical waveguide, another semiconductor device or any source of an optical signal.

2. The method of claim 1, including, placing at least one additional semiconductor device in said substrate.

3. The method of claim 2, wherein said forming said thin film overlay includes connecting bond pads on said at least one additional semiconductor device to electrically conductive pads on said layer of said thin film overlay facing away from said semiconductor device.

4. The method of claim 2, wherein said forming said thin film overlay includes connecting some of the bond pads of said semiconductor devices to each other and other of the bond pads to electrically conductive pads on a layer of said thin film overlay facing away from said semiconductor devices.

5. The method of claim 1, wherein the dimensions of said cavity match the dimensions of the semiconductor device.

6. The method of claim 5, including depositing a layer of device attach adhesive into said cavity before said semiconductor device is placed in said cavity.

7. The method of claim 1, wherein said forming said thin film overlay includes applying a first layer of dielectric material over the semiconductor device and a surface of said package adjacent and substantially parallel with said surface of said semiconductor device facing away from said package surface, forming a first conductive layer above and adjacent said first layer of dielectric material and patterning said first conductive layer into a first layer of conductors.

8. The method of claim 7, including forming vias filled with electrically conductive material, from conductors of said first layer of conductors, through said first layer of said dielectric material, and to said bond pads on said semiconductor device.

9. The method of claim 8, including forming a second pair of alternating dielectric and conductive layers, said second conductive layer being patterned into a second layer of conductors, said second dielectric layer being adjacent a previous layer of conductors.

10. The method of claim 9, including forming vias filled with electrically conductive material from conductors of said second conductive layer, through said second dielectric layer and to conductors of the first conductive layer.

11. The method of claim 8, including forming solder balls on said first layer of conductors.

12. The method of claim 8, including forming metal bumps on said first layer of conductors.

13. The method of claim 8, including forming polymer connectors on said first layer of conductors.

14. The method of claim 1, wherein said forming said thin film overlay includes applying a first layer of dielectric material over the semiconductor device and a surface of said package adjacent and substantially parallel with said surface of said semiconductor device facing away from said package surface, forming a second dielectric layer on said first dielectric layer and forming a first conductive layer above and adjacent said second layer of dielectric material and patterning said first conductive layer into a first layer of conductors.

15. The method of claim 8, including forming a first layer of dielectric material over said first pair of alternating dielectric and conductive layers, forming a second layer of dielectric material over said first layer of dielectric material over said first pair of alternating dielectric and conductive layers, and forming a second conductive layer over said second layer of dielectric material, said second conductive layer being patterned into a second layer of conductors, said first dielectric layer being adjacent a previous layer of conductors.

16. The method of claim 1, wherein said electrically conductive pads on a layer of said thin film overlay facing away from said semiconductor device are patterned into a ball grid array.

17. The method of claim 11, wherein said solder balls are used as an alignment mechanism for aligning an external optical receiver and/or transmitter to said device's optical receiver and/or transmitter.

18. The method of claim 7, wherein pads of said conductors are plated in preparation for solder ball attachment.

19. The method of claim 18, including a solder mask over said conductors, said solder mask exposing only said plated pads.

20. The method of claim 19, including forming solder balls on said plated pads.

21. The method of claim 10, including forming solder balls on the second layer of conductors.

22. The method of claim 10, including forming metal bumps on the second layer of conductors.

23. The method of claim 10, including forming polymer connectors on the second layer of conductors.

24. The method of claim 10, wherein pads of said second layer of conductors are plated in preparation for solder ball attachment.

25. The method of claim 24, including a solder mask over said second layer of conductors, said solder mask exposing only said plated pads.

26. The method of claim 25, including forming solder balls on said plated pads.

27. The method of claim 1, wherein said package is formed with heat slugs to facilitate heat dissipation.

28. The method of claim 1, wherein said substrate is formed of one of the group of ceramic, aluminum nitride, molded plastic, compound molded plastic, flex circuit/molded plastic, PWB laminate, artificial diamond.

29. A method, comprising:

forming a cavity in a substrate;

placing a semiconductor device in said cavity in said substrate, said semiconductor device having at least one optical receiver and/or transmitter adjacent a surface of said semiconductor device facing away from said substrate; and forming a multilayer thin film overlay on said surface of said semiconductor device and on a surface of said substrate adjacent and substantially parallel with said surface of said semiconductor device, said thin film overlay connecting bond pads on said semiconductor device to electrically conductive pads patterned in an array of continuous rows and columns on a layer of said thin film overlay facing away from said semiconductor device;

wherein said substrate comprises a metal top and PWB laminate sidewalls.

30. The method of claim 7, including the formation of a polymer layer between said layer of dielectric material and said conductive layer.

31. The method of claim 9, including the formation of a polymer layer between said second layer of dielectric material and said second conductive layer.

32. The method of claim 1, wherein said multilayer thin film overlay comprises two metal layers, a first dielectric layer 35 (um) in height, a first metal layer 4 (um) in height, a second dielectric layer 35 (um) in height, a second metal layer 4 (um) in height and a layer of solder mask material 35 (um) in height.

33. The method of claim 32, wherein said first dielectric layer is polyimide material, said first metal layer is Ti/Cu/Ti, said second dielectric layer is polyimide and said second metal layer is Ti/Cu/Ti.

34. The method of claim 1, wherein said substrate serves as a package for a device resulting from completion of the steps of claim 1.

* * * * *